(12) United States Patent
Flachowsky et al.

(10) Patent No.: US 9,431,508 B2
(45) Date of Patent: Aug. 30, 2016

(54) SIMPLIFIED GATE-FIRST HKMG MANUFACTURING FLOW

(71) Applicant: GLOBALFOUNDRIES Inc., Grand Cayman (KY)

(72) Inventors: Stefan Flachowsky, Dresden (DE); Jan Hoentschel, Dresden (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 100 days.

(21) Appl. No.: 14/047,517

(22) Filed: Oct. 7, 2013

(65) Prior Publication Data

US 2015/0097252 A1    Apr. 9, 2015

(51) Int. Cl.
| | |
|---|---|
| H01L 29/51 | (2006.01) |
| H01L 29/66 | (2006.01) |
| H01L 29/49 | (2006.01) |
| H01L 29/78 | (2006.01) |
| H01L 21/8238 | (2006.01) |
| H01L 21/28 | (2006.01) |
| H01L 21/768 | (2006.01) |

(52) U.S. Cl.
CPC ....... *H01L 29/517* (2013.01); *H01L 21/28088* (2013.01); *H01L 21/76805* (2013.01); *H01L 21/823828* (2013.01); *H01L 21/823835* (2013.01); *H01L 29/495* (2013.01); *H01L 29/4916* (2013.01); *H01L 29/4966* (2013.01); *H01L 29/665* (2013.01); *H01L 29/78* (2013.01); *H01L 29/7833* (2013.01)

(58) Field of Classification Search
USPC ........................................................ 438/283
See application file for complete search history.

(56) References Cited

U.S. PATENT DOCUMENTS

| | | | |
|---|---|---|---|
| 6,821,887 B2 | 11/2004 | Wieczorek et al. | |
| 7,816,218 B2 * | 10/2010 | Klaus et al. ................. | 438/301 |
| 7,863,123 B2 * | 1/2011 | Bu ..................... | H01L 21/28079 |
| | | | 257/E21.438 |
| 8,120,114 B2 * | 2/2012 | Ott ..................... | H01L 21/2807 |
| | | | 257/364 |
| 2011/0241086 A1 | 10/2011 | Kurz et al. | |
| 2012/0156839 A1 | 6/2012 | Scheiper et al. | |

OTHER PUBLICATIONS

Translation of official action from Taiwan patent application No. 103128588 dated Sep. 2, 2015.

* cited by examiner

*Primary Examiner* — Robert Carpenter
(74) *Attorney, Agent, or Firm* — Amerson Law Firm, PLLC

(57) ABSTRACT

When forming field effect transistors according to the gate-first HKMG approach, the cap layer formed on top of the gate electrode had to be removed before the silicidation step, resulting in formation of a metal silicide layer on the surface of the gate electrode and of the source and drain regions of the transistor. The present disclosure improves the manufacturing flow by skipping the gate cap removal process. Metal silicide is only formed on the source and drain regions. The gate electrode is then contacted by forming an aperture through the gate material, leaving the surface of the gate metal layer exposed.

24 Claims, 16 Drawing Sheets

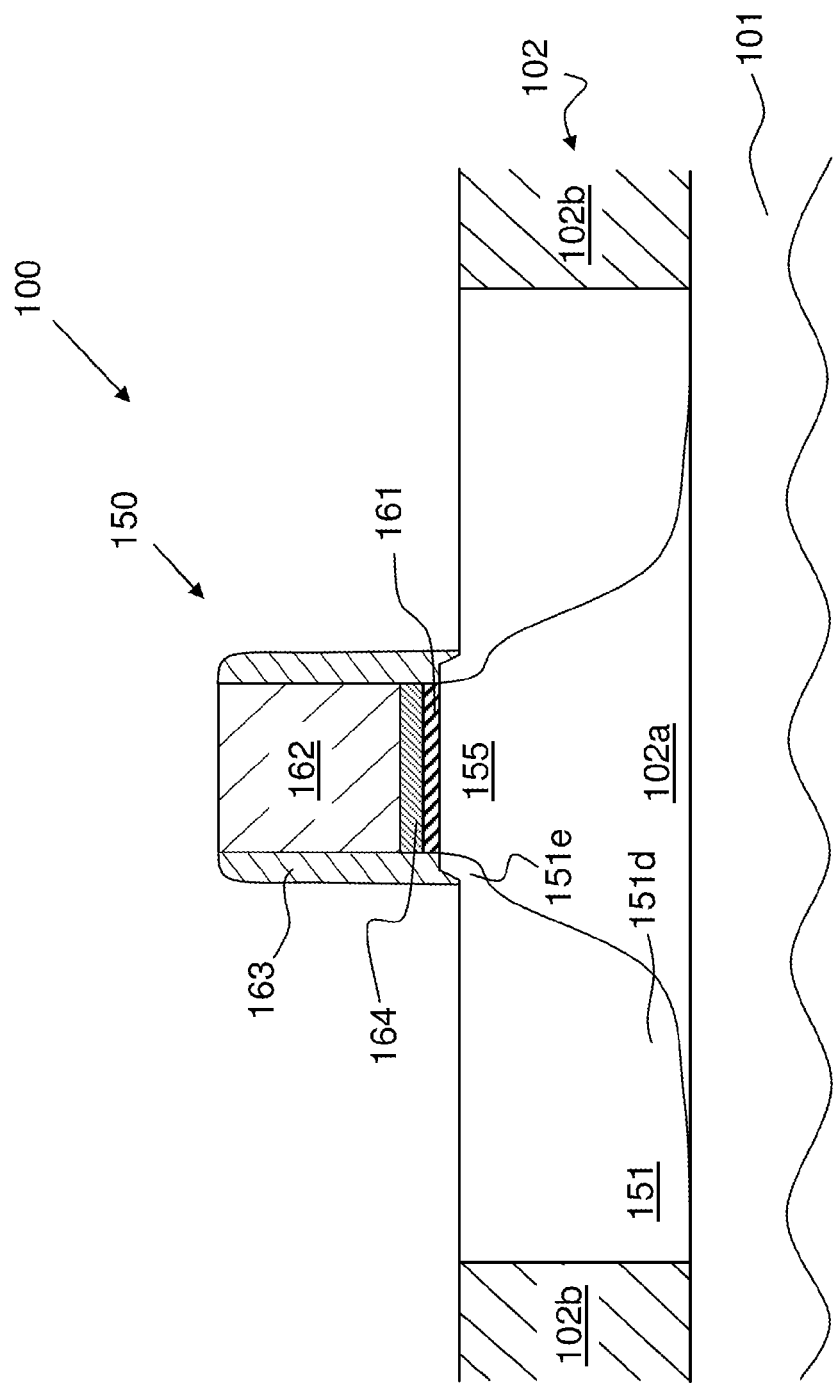

SIMPLIFIED GATE-FIRST HKMG MANUFACTURING FLOW

BACKGROUND OF THE INVENTION

1. Field of the Invention

Generally, the present disclosure relates to integrated circuits, and, more particularly, to transistors comprising a gate with a metal layer.

2. Description of the Related Art

Transistors are the dominant components in modern electronic devices. Currently, several hundred millions of transistors may be provided in presently available complex integrated circuits, such as microprocessors, CPUs, storage chips and the like. It is then crucial that the typical dimensions of the transistors included in an integrated circuit have as small as possible typical dimensions, so as to enable a high integration density.

One of the most widespread technologies is the complementary metal-oxide-semiconductor (CMOS) technology, wherein complementary field effect transistors (FETs), i.e., P-channel FETs and N-channel FETs, are used for forming circuit elements, such as inverters and other logic gates, to design highly complex circuit assemblies.

Transistors are usually formed in active regions defined within a semiconductor layer supported by a substrate. Presently, the layer in which most integrated circuits are formed is made out of silicon, which may be provided in crystalline, polycrystalline or amorphous form. Other materials, such as, for example, dopant atoms or ions, may be introduced into the original semiconductor layer.

When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride, in the case of silicon-based devices.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high temperature source/drain formation and all silicide annealing cycles have been carried out.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges and requires new integration schemes with respect to the conventional poly/SiON technology.

For example, new materials have to be found in order to tune the work function of gate electrode species, so as to adjust the transistor threshold voltage to a desired level.

In the gate-first HKMG approach, a thin film of a silicon/germanium alloy (SiGe) is deposited on the surface of the silicon layer in order to adjust the transistor threshold voltage to a desired level. Since a portion of this thin film is included in the channel region of the FET, this SiGe thin film is also commonly referred to as "channel SiGe."

Since epitaxial SiGe epitaxially grown on silicon experiences a compressive stress, SiGe alloys may also be used to introduce a desired stress component into the channel region of a P-channel FET. This is a desirable effect since the mobility of holes in the channel region of a P-channel FET is known to increase when the channel region experiences a compressive stress. Thus, trenches can be formed in portions of the source and drain regions of a FET adjacent to the channel region. An SiGe alloy, or a semiconductor alloy in general, can subsequently be epitaxially grown in the trenches. This semiconductor alloy is also commonly referred to as "embedded semiconductor alloy" or, in the particular case of an SiGe alloy, "embedded SiGe."

Furthermore, in the HKMG technology, a thin "work function metal" layer is inserted between the high-k dielectric and the gate material placed above the high-k dielectric. The threshold voltage can thus be adjusted by varying the thickness of the metal layer. The gate metal layer may comprise, for example, tantalum (Ta), tungsten (W), titanium nitride (TiN) or tantalum nitride (TaN).

According to the gate-first HKMG approach, the gate structure is formed by depositing a stack of layers, which is subsequently appropriately patterned so as to obtain a gate structure of the desired size and dimensions. The stack of layers thus deposited ends with a cap layer formed on top of a gate material. The gate material is typically comprised of polysilicon. The gate cap layer, usually comprised of silicon nitride ($Si_3N_4$), is initially exposed and is used as a protection layer for the lower-lying layers during the gate patterning process and the following manufacturing stages. In order to permit silicidation of the polysilicon gate material, the cap layer is generally removed after forming the gate structure and before performing the silicidation process.

FIGS. 1a-1i show subsequent stages during a manufacturing process flow of a semiconductor structure including a FET according to the prior art.

FIG. 1a shows a semiconductor structure 100 comprising a semiconductor layer 102 in which an active region 102a has been formed. The active region 102a is laterally delimited by isolation regions 102b, which may be, for example, shallow trench isolations. The semiconductor layer 102 is supported by a substrate 101, which may be comprised of any suitable carrier.

A gate structure 160 of a transistor 150 has been formed on the surface of the active region 102a. The gate structure 160 shown in FIG. 1a has been formed according to the gate-first HKMG approach. Thus, the stack making up the gate structure 160 comprises an insulation layer 161 formed on the surface of the active region 102a, a gate metal layer 164, a gate material 162, and a cap layer 166 formed on the gate material 162 and exposing an upper surface to the outside.

The insulation layer 161, formed on the surface of the active region 102a, comprises a high-k material. The gate metal layer 164 is formed between the insulation layer 161 and the gate material 162 so as to adjust the transistor threshold voltage, as described above. The gate material 162, formed directly on the upper surface of the gate metal layer 164, typically comprises a semiconductor such as polysilicon. The cap layer 166 is formed at the top of the gate stack and is usually comprised of an insulating, relatively tough material, such as, for example, $Si_3N_4$.

FIG. 1b shows that, after forming the gate structure 160, a spacer structure 163 is formed on the sidewalls of the gate structure 160 in order to protect sensitive materials included in the gate stack, such as, for example, the metal of the metal layer 164. Thereafter, several series of implantations are performed in order to define source and drain regions 151 of the transistor 150 in the active region 102a.

Initially, a first series of implantations is performed so as to define extension regions 151e and halo regions (not shown) of the source and drain regions 151 in the active region 102a. During this first series of implantations, the spacer structure 163 has an initial thickness, which is usually less than the final thickness.

Although not shown in the figures, a semiconductor alloy layer may be optionally embedded into the source/drain regions 151 after performing the halo/extension implantations. The embedded semiconductor alloy is used in order to provide a compressive stress component to the channel region of the FET 150. This is particularly advantageous in the case of P-channel FETs.

As shown in FIG. 1c, the gate cap layer 166 is usually removed after performing the halo/extension implantations. The gate cap layer removal may be achieved by using an optical planarization layer (OPL) 170, as shown in FIG. 1c. Alternatively, a sacrificial oxide spacer may be applied on the surface of the semiconductor structure 100.

The gate cap layer 166 is usually removed by performing a first etch (not shown) in the presence of the OPL 170. After removing the gate cap layer 166, the OPL 170 or the oxide spacer are removed by performing a second etch 183 shown in FIG. 1d.

FIG. 1d shows the semiconductor structure 100 after performing the second etch process 183 aimed at removing the OPL or oxide spacer 170. The etch process 183 usually also removes a surface portion of the active region 102a. Therefore, the surface of the active region 102a is recessed after removing the OPL 170 with respect to the initial level. This is undesirable, since the thickness of the active region 102a is decreased by the etch process and, if a semiconductor alloy has been embedded in the source/drain regions 151, this is also partially removed.

FIG. 1e shows a subsequent stage in the manufacturing flow, wherein a further series of implantations is performed in order to define deep regions 151d of the source and drain regions 151. Before performing these deep region implantations, the spacer structure 163 may be appropriately broadened so as to serve as an implantation mask also during the deep implantations. After all implantations have been performed, the semiconductor structure 100 undergoes an annealing process aimed at activating the implanted ions and favoring recovery of the crystalline lattice of the semiconductor layer 102 after implantation damage. A channel region 155 of the transistor 150 is thus defined in the active region 102a. The channel region 155 is laterally defined by the source and drain regions 151.

After the activation annealing, a silicidation process is performed, the results of which are shown in FIG. 1f. During the silicidation process, a refractory metal layer (not shown) is deposited onto the exposed face of the semiconductor structure 100. Subsequently, a heat treatment is applied to the semiconductor structure 100 in order to promote a chemical reaction between the metal atoms of the deposited layer and the silicon atoms of the exposed surface of the semiconductor structure 100.

As a result of the silicidation, a metal silicide layer 153 is formed on the source and drain regions 151. Furthermore, a metal silicide layer 162a is formed after silicidation on top of the gate structure 160, thus forming an interface with the gate material 162 exposed before the deposition of the refractory metal layer. The formation of the metal silicide layer 162a is possible thanks to the gate cap layer removal process described above, which results in the gate material 162, typically polysilicon, being exposed to the outside before the deposition of the refractory metal layer. The metal silicide layers 153 and 162a typically comprise nickel silicide.

As shown in FIG. 1g, after formation of the silicide layers 153 and 162a, a stressed material layer 120 is deposited onto the surface of the semiconductor structure 100. Subsequently, a UV curing process is applied at a temperature ranging from 400-500° C.

An interlayer dielectric layer 130 is then deposited onto the stressed material layer 120, as shown in FIG. 1h. Thereafter, an etching process 181 is then applied, for example, in the presence of a patterned mask, in order to form via openings 172 and 174, as shown in FIG. 1i. The etching process 181 is calibrated so as to stop at the metal silicide layers 153 and 162a, so that openings 172 and 174 extend across the interlayer dielectric layer 130 and the stressed layer 120. Thus, openings 172 expose predetermined portions of the metal silicide layer 153 contacting the source and drain regions 151. On the other hand, via openings 174 expose predetermined portions of the metal silicide layer 162a contacting the gate material 162.

The method described above is affected by several drawbacks. First of all, a removal process of the gate cap layer 166 is necessary in order to permit formation of the metal silicide layer 162a contacting the gate material 162. This process, described above with reference to FIG. 1c, is usually rather lengthy and complicated, thus resulting in increased manufacturing times and costs.

The gate cap layer removal process also results in undesirable damages to the surface of the layer on which the transistor is manufactured. As described above with reference to FIG. 1d, the etching process 183 performed in order to remove the coating layer 170 may likely erode a portion of the semiconductor layer 102, thus undesirably causing thinning of the active region 102a. If a semiconductor alloy, such as SiGe, has been embedded in the active region 102a of the transistor 150, this can also be undesirably removed by the etching process.

Furthermore, since the gate material 162 formed on top of the gate metal layer 164 is usually a semiconductor, for example polysilicon, a Schottky barrier is established at the interface between the gate metal layer 164 and the gate semiconductor material 162. This undesirably degrades the AC performance by limiting the circuit switching speed.

A method of solving the problem of the Schottky barrier is forming a so-called "fully silicided" gate, i.e., a gate wherein the metal silicide completely replaces the semiconductor gate material 162, so as to directly form an interface with the gate metal layer 164. An example of a manufacturing method of a fully silicided metal gate can be found in U.S. Pat. No. 6,831,887.

The methods of forming a fully silicided gate known from the prior art use the same silicidation step for forming the metal silicide layer 153 on the source/drain regions and the metal silicide layer 162a on top of the gate, as described above. Thus, the thickness of the gate metal silicide layer 162a cannot be increased without simultaneously increasing the thickness of the source/drain metal silicide layer 153. However, the thickness of the metal silicide layer 153 cannot be increased at will, since it must be considerably smaller than the thickness of the semiconductor layer 102.

Thus, there exists room for a simplified, more cost-effective manufacturing process of a transistor structure, resulting in a more effective contact to the gate electrode.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the new and inventive idea that the manufacturing process of a transistor can be improved by skipping the gate cap removal process and forming an opening in the gate electrode exposing the surface of the gate metal layer or of an etch-stop layer formed directly on the gate metal layer. Based on this idea, a semiconductor structure is provided that includes an active region formed in a semiconductor layer, a transistor having a source region and a drain region formed in the active region, the transistor further including a gate structure having a gate bottom portion formed on the active region, a gate material formed on the gate bottom portion and a gate cap layer formed on the gate material, and a dielectric layer formed on the surface of the transistor and having an exposed surface, wherein the semiconductor structure includes an opening extending through the insulating layer, the gate cap layer and the gate material so as to leave exposed a predetermined surface area of the gate bottom portion. In this manner, since the gate cap layer is maintained in the final structure, the lengthy process of removing the cap layer can be advantageously removed from the manufacturing flow. Furthermore, since the opening leaves the surface of the bottom portion of the gate electrode exposed, no Schottky barrier is formed at the interface between the gate electrode and the metal contacting the gate metal layer.

A method of forming a semiconductor structure is also provided which includes forming an active region in a semiconductor layer, forming a gate structure of a transistor, the gate structure having a gate bottom portion formed on the active region, a gate material formed on the gate bottom portion and a gate cap layer formed on the gate material, forming source and drain regions of the transistors in the active region, forming a dielectric layer on the surface of the transistor in the presence of the gate cap layer, and forming an opening extending through the dielectric layer, the gate cap layer and the gate material so as to leave exposed a predetermined surface area of the gate bottom portion.

BRIEF DESCRIPTION OF THE DRAWINGS

The disclosure may be understood by reference to the following description taken in conjunction with the accompanying drawings, in which like reference numerals identify like elements, and in which:

FIGS. 1a-1i schematically illustrate cross-sectional views of a semiconductor structure comprising a transistor during subsequent stages of a manufacturing process flow according to the prior art.

Figure 1A:
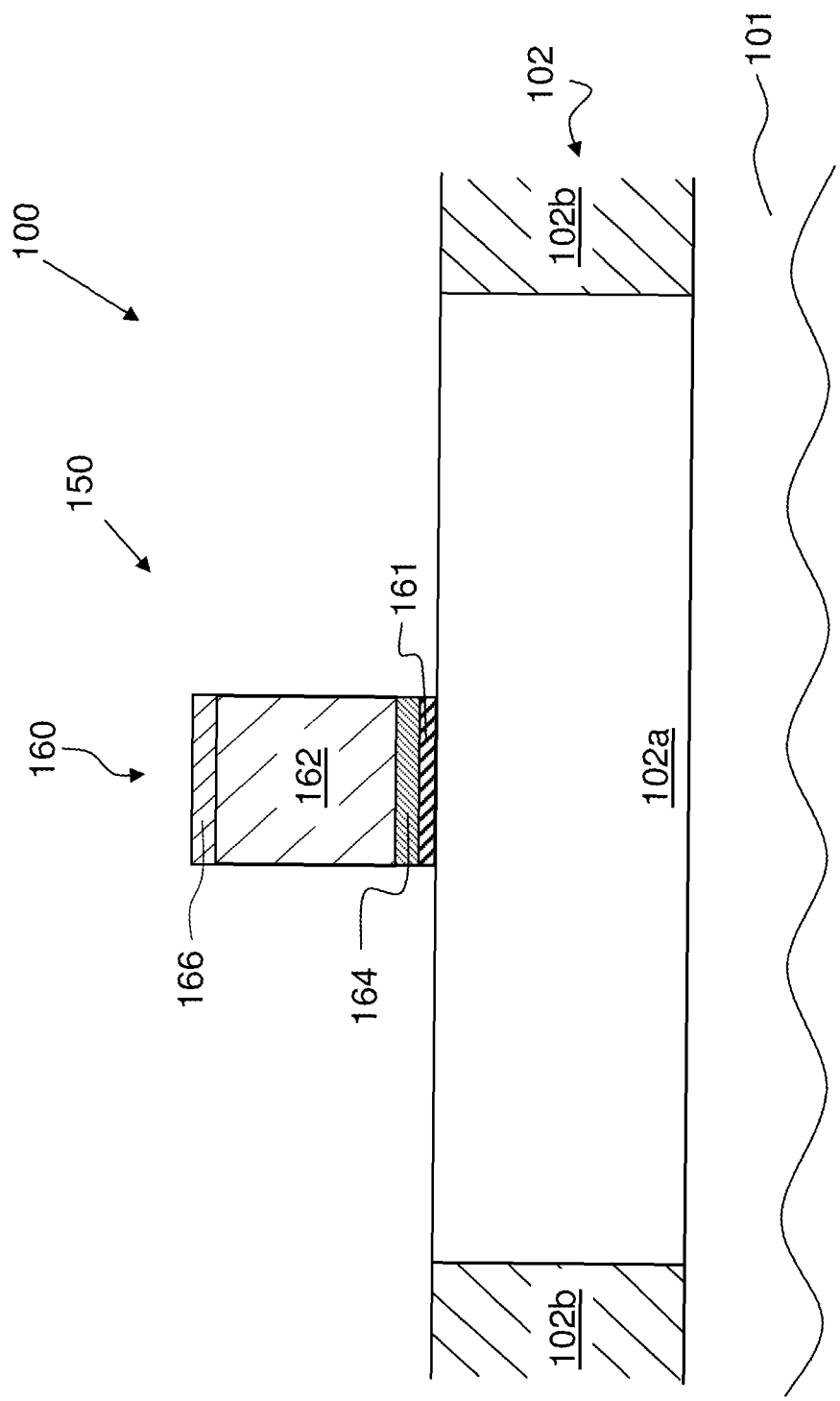
Figure 1B:
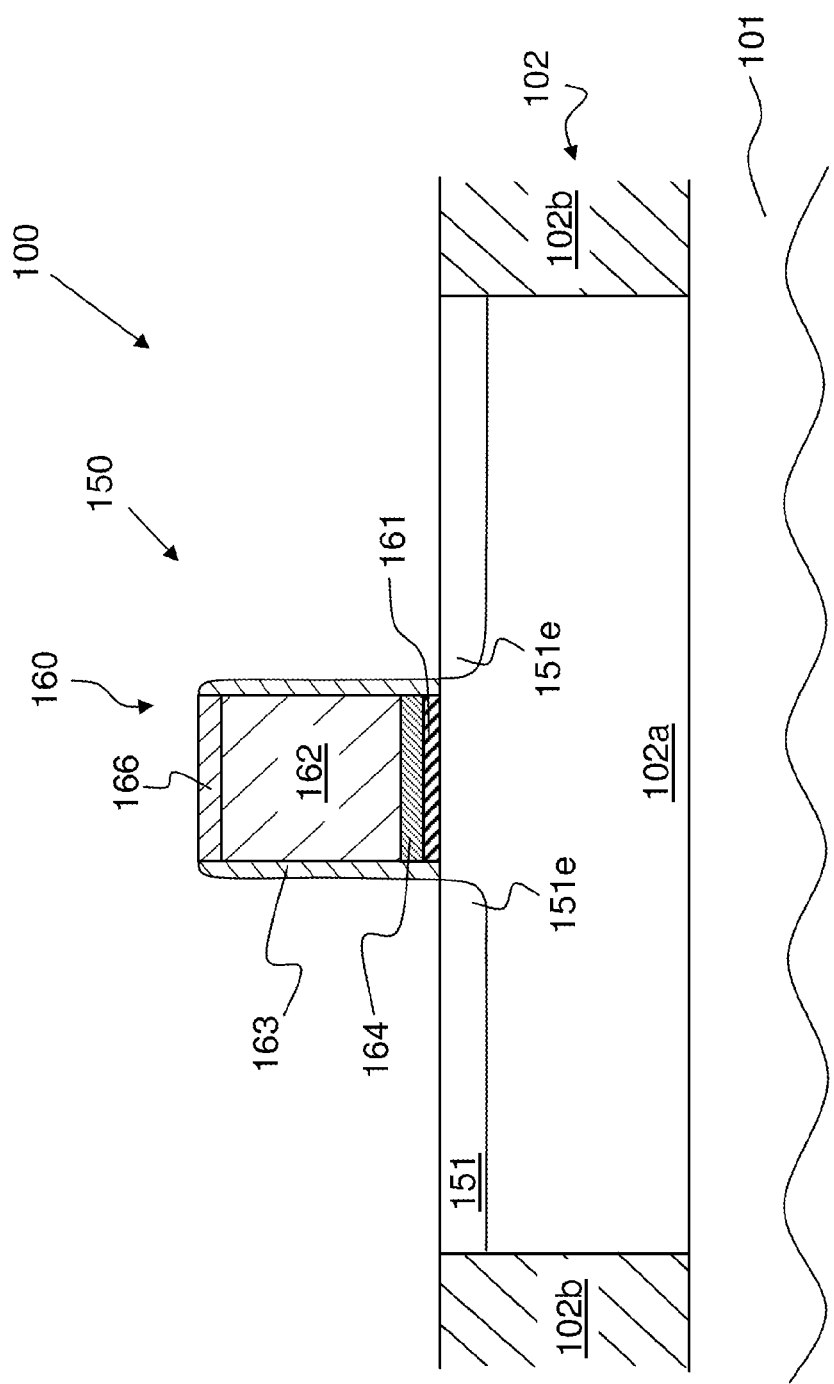
Figure 1C:
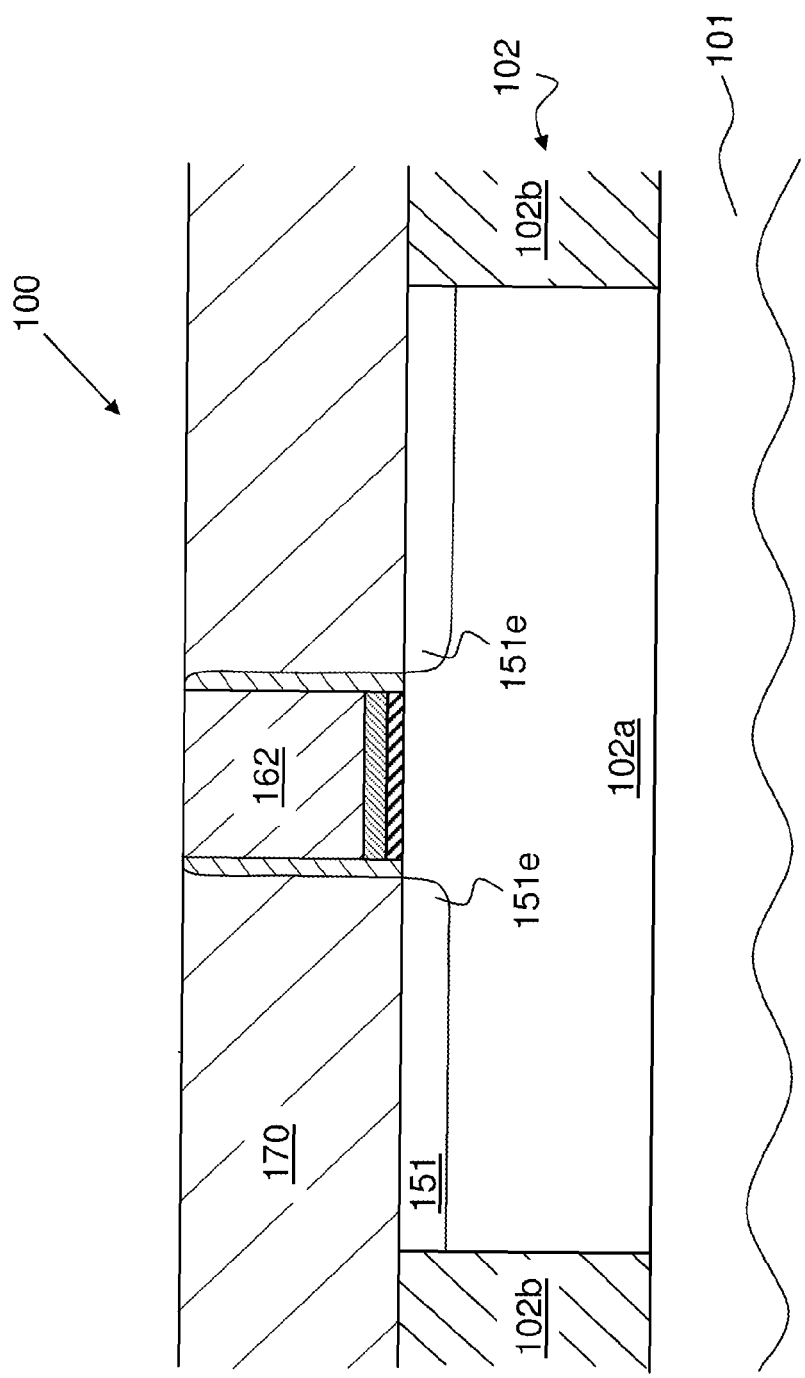

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be noted that, where appropriate, the reference numbers used in describing the various elements illustrated in FIGS. 2a-2g substantially correspond to the reference numbers used in describing the corresponding elements illustrated in FIGS. 1a-1i above, except that the leading numeral for corresponding features has been changed from a "1" to a "2". For example, semiconductor structure 100 corresponds to semiconductor structure 200, gate insulation layer 161 corresponds to gate insulation layer 261, gate electrode 160 corresponds to gate electrode 260, and so on. Accordingly, the reference number designations used to identify some elements of the presently disclosed subject matter may be illustrated in FIGS. 2a-2g but may not be specifically described in the following disclosure. In those instances, it should be understood that the numbered elements shown in FIGS. 2a-2g which are not described in detail below substantially correspond with their like-numbered counterparts illustrated in FIGS. 1a-1i, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 200 depicted in FIG. 2a, it should be understood that the gate electrode structure 260 is formed "above" the active region 202a and the gate metal layer 264 is formed "below" the gate material 262.

FIGS. 2a-2g show subsequent stages during a semiconductor structure manufacturing process flow according to an embodiment of the present invention.

Figure 2A:
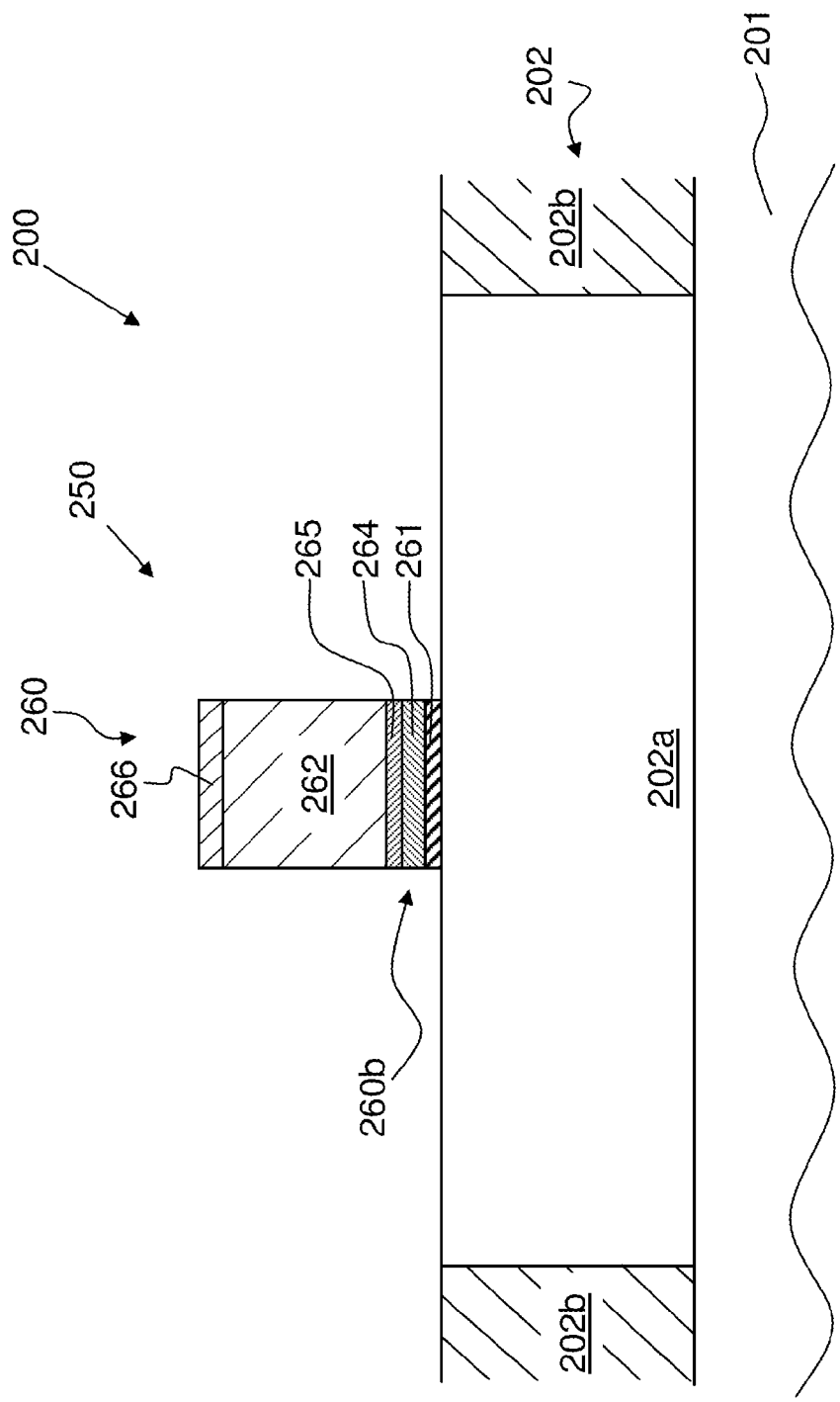
FIGS. 2a-2g schematically illustrate cross-sectional views of a semiconductor structure during subsequent manufacturing stages of a manufacturing process flow according to an embodiment of the present invention.

FIG. 2a shows a cross-section of a semiconductor structure 200 during an advanced manufacturing stage substantially corresponding to the fabrication method according to the prior art shown in FIG. 1a.

The semiconductor structure 200 comprises a semiconductor layer 202 in which isolation regions 202b have been formed. The isolation regions 202b may comprise, for example, shallow trench isolations. The isolation regions 202b laterally define an active region 202a. A plurality of active regions 202a may be formed in the semiconductor layer 202, although only one is shown in FIG. 2a. One or a series of implantations, e.g., well implantations, may have been performed in order to provide the active region 202a with a desired doping profile.

According to one embodiment, the semiconductor layer 202 comprises silicon. According to a particular embodiment, the semiconductor layer 202 comprises mono-crystalline silicon.

The layer 202 is formed attached to a substrate 201. The substrate 201, which may represent any appropriate carrier material, and the semiconductor layer 202 may form an SOI (silicon-on-insulator) configuration. Alternatively, the semiconductor layer 202 may be formed in the bulk of the substrate 201. Although not shown, a thin film of a semiconductor alloy, e.g., a channel SiGe film, may have been epitaxially formed on the surface of the semiconductor layer 202.

The semiconductor structure 200 comprises a transistor 250 formed partly in and partly on the semiconductor layer 202. The transistor 250 may be a FET, for example an N-channel FET or a P-channel FET. For example, the transistor 250 may form with a second transistor of an opposite polarity (not shown) a pair used in the CMOS technology.

The transistor 250 comprises a gate structure 260, formed on the surface of the semiconductor layer 202 after having defined the active region 202a and, where needed, after forming the channel SiGe film. The gate structure 260 is preferably formed according to the HKMG technology. According to a particular embodiment, the gate structure 260 is performed according to the gate-first HKMG approach.

Thus, the gate structure 260 comprises a gate insulating layer 261 comprising a high-k material. By high-k material, it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

The gate structure 260 further comprises a gate metal layer 264 formed on the gate insulating layer 261 in order to permit threshold voltage adjustment. The gate metal layer 264 may comprise a metal such as tantalum (Ta) or tungsten (W). Preferably, the gate metal layer 264 comprises a nitride such as, for example, titanium nitride (TiN) or tantalum nitride (TaN). A certain percentage of a work function metal species, such as aluminum and the like, may be included in the gate metal layer 264 in combination with other materials.

Figure 2B:
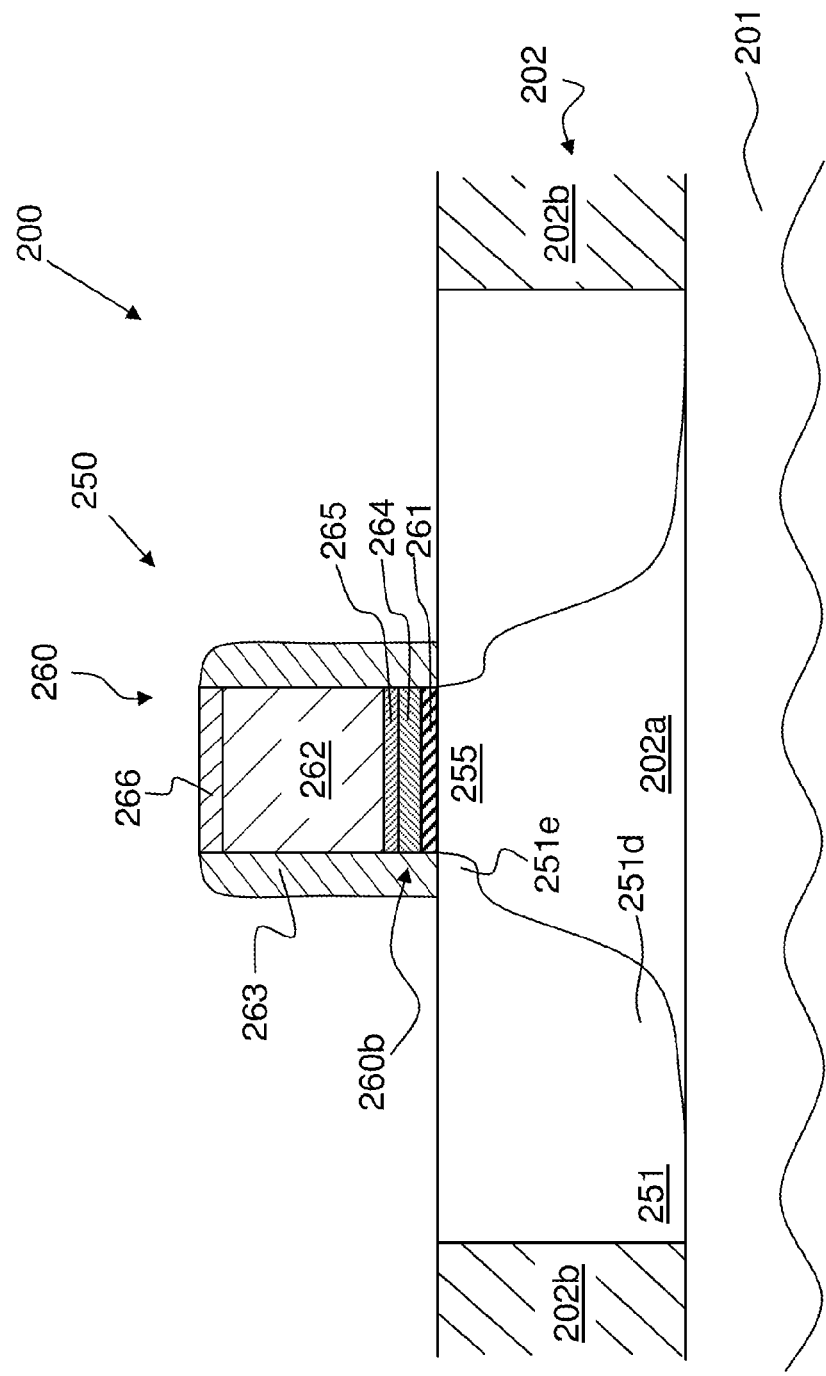
Figure 2C:
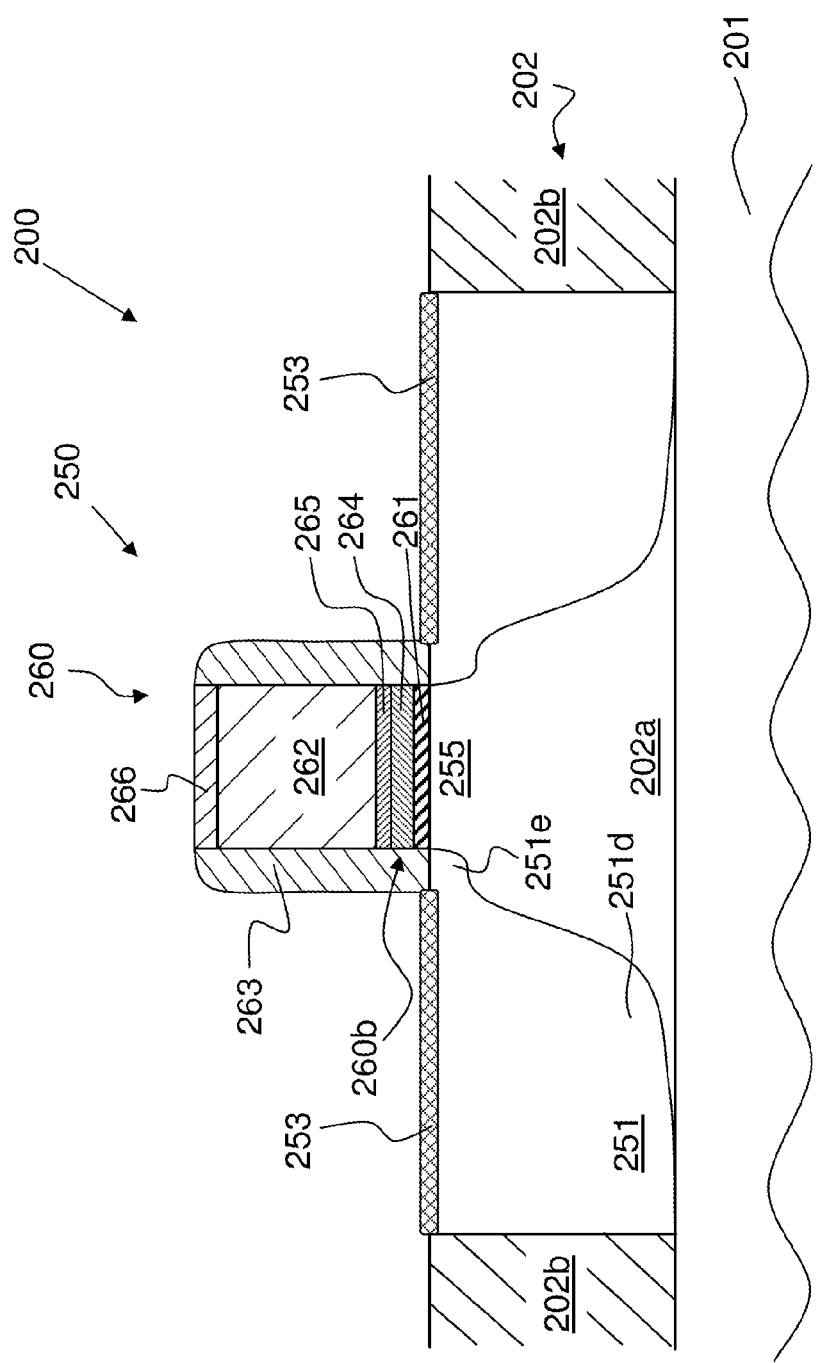

According to the embodiment shown in FIG. 2a, an etch-stop layer 265 is formed on the gate metal layer 264. The etch-stop layer 265 is formed from a material which is either not affected, or eroded to a negligible extent, when an etching process described in the following is performed. Etching 281, shown in FIG. 2f, is used in order to form openings 272 and 274, leaving exposed predetermined surface portions of the transistor 250, as will be more extensively explained in the following. In general, the thickness of the etch-stop layer 265 depends on the parameters of the etching process 281. In some embodiments, the etch-stop layer 265 may have a thickness of a few nanometers.

Again with reference to FIG. 2a, the etch-stop layer 265 is preferably comprised of one or more electrically conductive materials. In particular, the etch-stop layer 265 is preferably formed in such a way that its ohmic resistance is low, so that the surface of the etch-stop layer 265 is at about the same electrical potential as the surface of the gate metal layer 264. Advantageously, the etch-stop layer 265 may comprise a metal whose etch rate is low when exposed to etch 281. In some embodiments, the etch-stop layer 265 comprises aluminum.

A gate material 262 is then formed on the etch-stop layer 265. According to other embodiments not shown in the figures, the gate material 262 is formed directly on the surface of the gate metal layer 264, without the presence of the etch-stop layer 265. Typically, the gate material 262 comprises a semiconductor. In some embodiments, the gate material 262 comprises polysilicon.

A cap layer 266 is finally formed on top of the gate material 262. The cap layer 266 comprises an upper surface exposed towards the outside of the gate structure 260. The cap layer 266 typically comprises a tough insulator such as, for example, silicon nitride ($Si_3N_4$).

According to one embodiment, the length of the gate structure 260, i.e., the extension of the gate material 262 along the horizontal direction in FIG. 2a, is less than 50 nm. According to a particular embodiment, the length of the gate structure 260 is 28 nm or smaller.

After forming the gate structure 260, source and drain regions 251 of the transistor 250 are defined. This is achieved by carrying out a series of ion implantations. With reference to FIG. 2b, during the first implantation stage, halo regions (not shown) and extension regions 251e of the source/drain regions 251 are formed. The extension regions 251e define the length of the channel region 255 of the transistor 250.

Advantageously, a spacer structure 263 may be formed on the sidewalls of the gate structure 260 of an appropriate thickness (not shown in the figure) to be used as an implantation mask during halo/extension implantations. The spacer structure is, in general, formed of a dielectric material.

Typically, the spacer structure 263 comprises silicon nitride (Si$_3$N$_4$) or silicon dioxide (SiO$_2$). The spacer structure 263 also carries out the task of protecting sensitive materials included in the gate stack, such as, for example, the materials included in the gate metal layer 264.

After forming the gate structure 260, trenches may be formed in the active region 102a besides the gate structure 260, which may be epitaxially filled with a semiconductor alloy, e.g., an SiGe alloy. For example, the semiconductor alloy may be embedded after performing the halo/extension implantations. The semiconductor alloy may be embedded in the active region 202a in order to apply a predetermined stress to the channel region of the transistor 250. This may be desirable in the case of a P-channel FET, wherein a compressive strain component is known to advantageously increase the mobility of holes in the channel region.

After performing halo/extension implantations and, where needed, after embedding the semiconductor alloy in the active region 202a, a further implantation stage is performed in order to form deep regions 251d of the source/drain regions 251. Conveniently, the spacer structure 263 may have been broadened between halo/extension implantations and deep implantations, so as to serve as an implantation mask of a proper thickness when performing deep implantations.

According to the method known from the prior art, the cap layer 266 of the gate structure 260 is removed after performing the halo/extension implantations and before carrying out the deep region implantations. Conversely, according to the present disclosure, the cap layer 266 is maintained all across the implantations defining deep regions 251d. Thus, deep implantations are also performed in the presence of the cap layer 266.

After performing halo/extension implantations and deep source/drain implantations, an annealing step is performed in order to activate the doping species and to allow the crystal lattice of the semiconductor layer 202 to recover after implantation damage. After the annealing step, the channel region 255 is established in the active region 202a between the source and drain regions 251.

FIG. 2b shows the semiconductor structure 200 after the annealing step. The gate cap layer 266 is still present after all implantations have been performed and after the system has been annealed for implanted ion activation.

After defining source/drain regions 251 and performing the activation annealing, a silicidation process is carried out on the semiconductor structure 200 in order to form a metal silicide layer electrically contacting the source and drain regions 251. The result of this silicidation process is schematically shown in FIG. 2c.

At the beginning of the silicidation process, a refractory metal layer (not shown) is deposited on the surface of the semiconductor structure 200. It should be noted that, in contrast to the known method, the deposition of the refractory metal film is performed in the presence of the gate cap layer 266.

The refractory metal layer may comprise, for example, a metal, such as nickel, titanium, cobalt and the like. Preferably, the refractory metal layer comprises nickel. The refractory metal layer may also comprise platinum, which, in some cases, may promote a more homogeneous formation of nickel monosilicide. In contrast to the method known from the prior art, the deposition of the refractory metal layer is performed in the presence of the gate cap layer 266.

After depositing the refractory metal layer, a heat treatment is applied to the semiconductor structure 200 in order to initiate a chemical reaction between the metal atoms in the refractory metal layer and the silicon atoms in those areas of the source and drain regions 251 that are in contact with the metal layer, thereby forming metal silicide regions that substantially comprise low-resistivity nickel monosilicide. Non-reacted metal atoms included in the refractory metal layer are removed after the heat treatment.

As shown in FIG. 2c, due to the silicidation process, a metal silicide layer 253 has formed in and on top of the active region 202a, so as to form an interface with the source and drain regions 251. The metal silicide layer 253 preferably comprises nickel silicide. The thickness of the refractory metal layer and the parameters of the subsequent heat treatment, such as the temperature and the heating time, are chosen so as to obtain a desired thickness of the metal silicide layer 253.

It should be noted that, during the heat treatment, the silicon atoms in the spacer structure 263 and in the cap layer 266 do not take part in the chemical reaction with the metal layer, since they contribute to formation of thermally stable silicon dioxide or silicon nitride layers. Since the first silicidation process is carried out in the presence of the spacer structure 263 and the gate cap layer 266, the silicidation process does not result in formation of any metal silicide regions forming an interface with the gate material 262. Thus, the thickness of the metal silicide layer 253 may be adjusted independently of other system parameters, such as, for example, the thickness of a metal silicide layer contacting the gate structure 260.

After completing the silicidation process, a dielectric layer is deposited onto the surface of the semiconductor structure 200. According to the claimed method, the gate cap layer 266 is not removed from the gate structure 260 after the silicidation process. Thus, the deposition of the dielectric layer is performed in the presence of the gate cap layer 266.

Figure 2D:
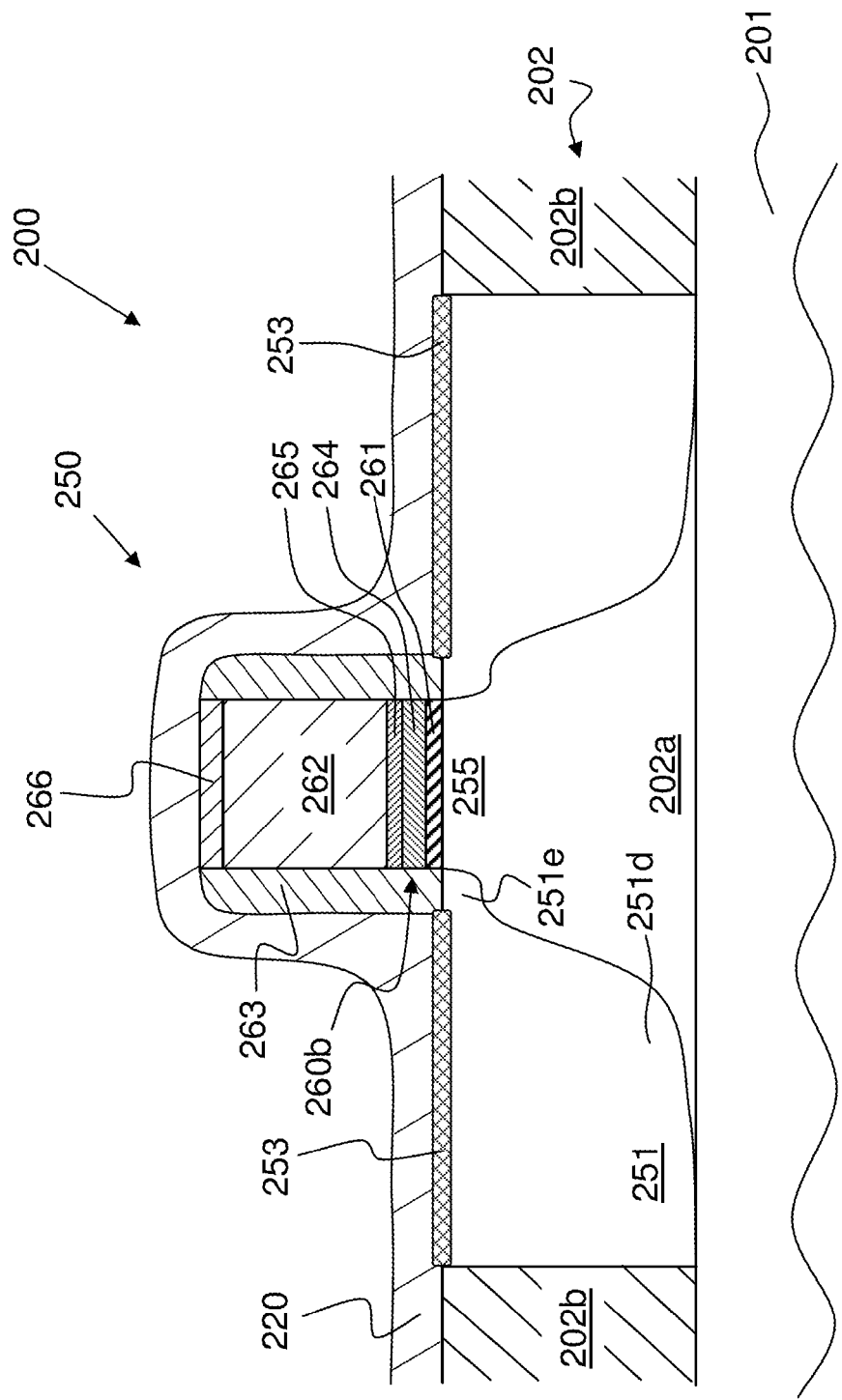
Figure 2E:
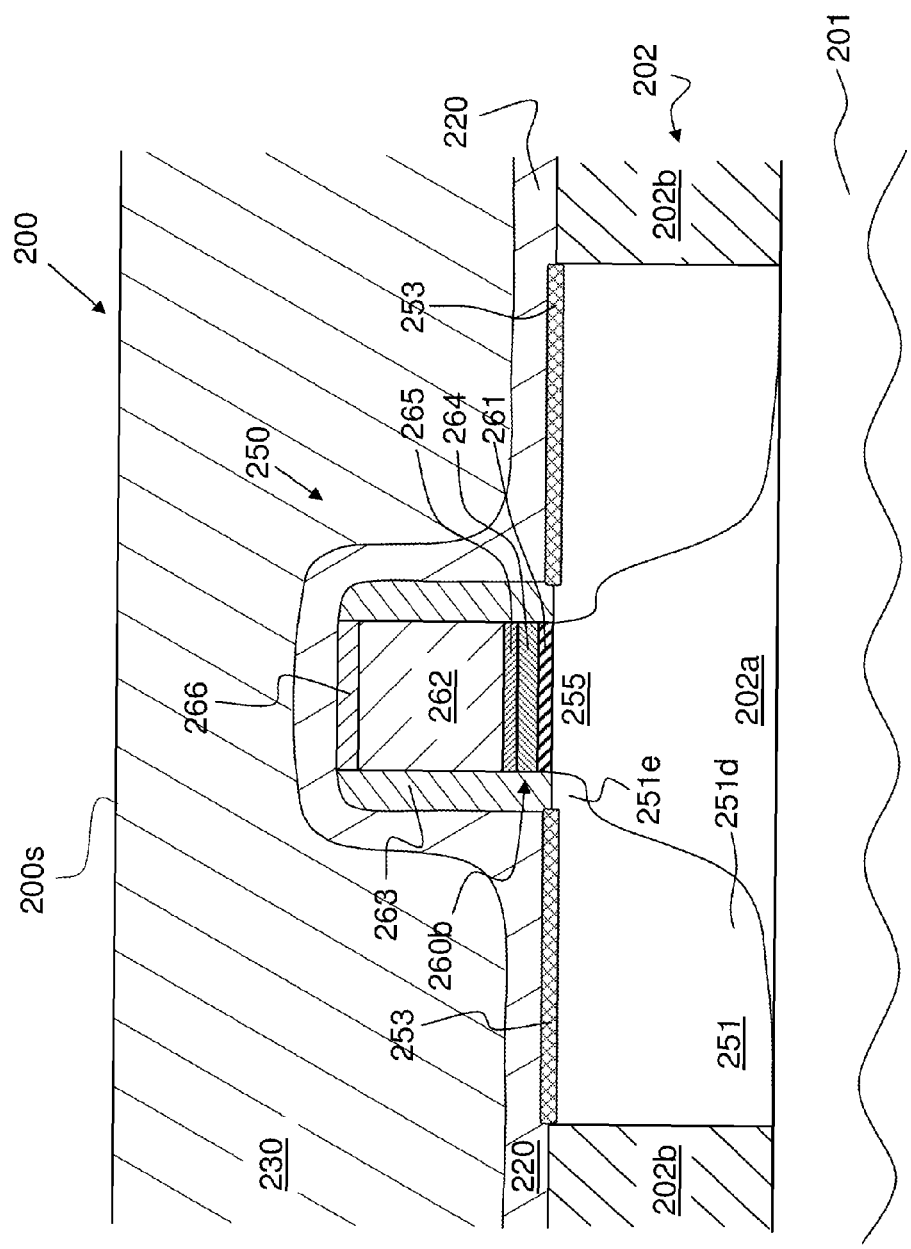
Figure 2F:
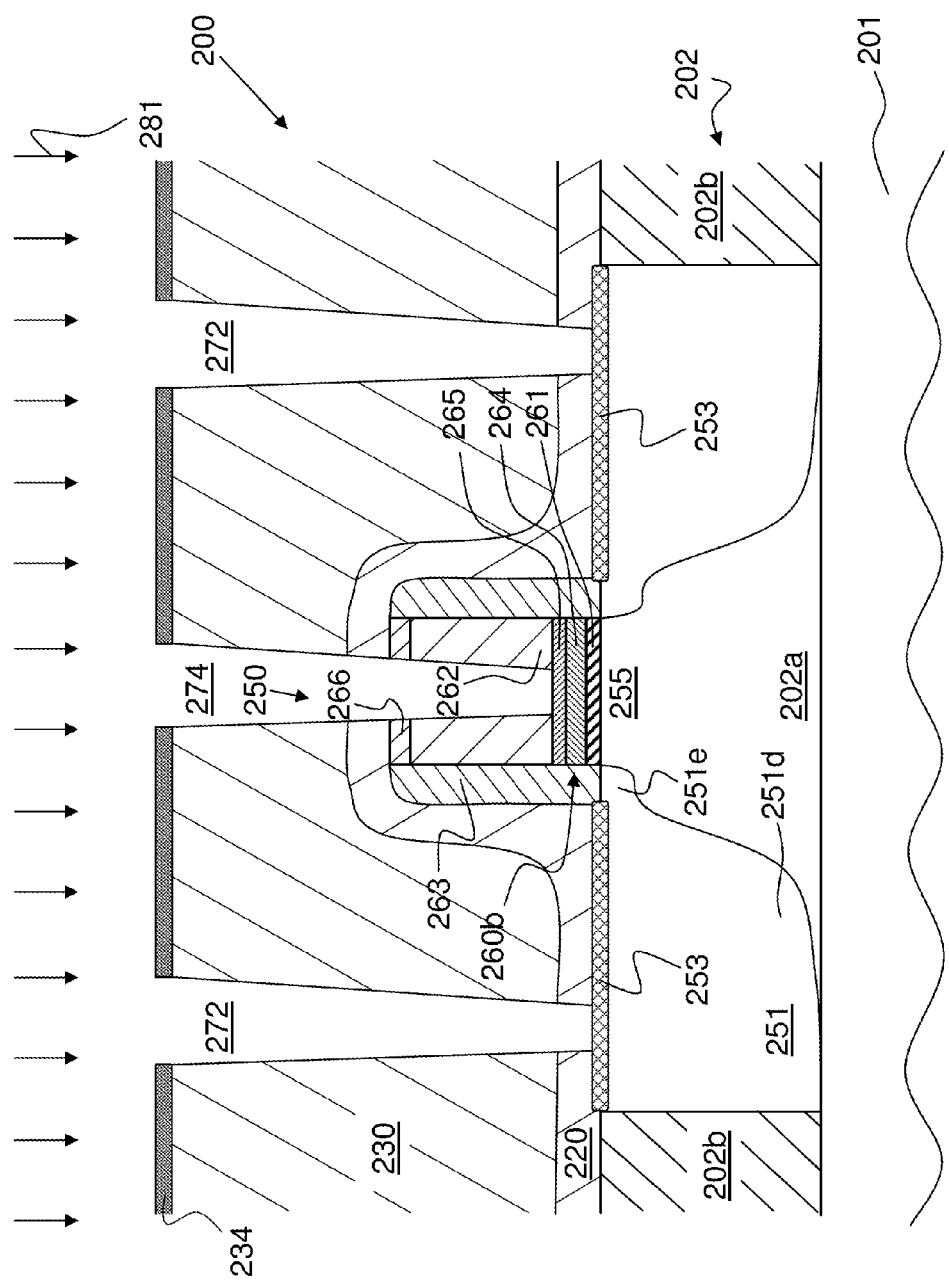

According to the embodiment shown in FIGS. 2d-2g, the dielectric layer comprises a stressed material layer 220 (FIG. 2d) and an interlayer dielectric layer 230 (FIG. 2e). In other embodiments not shown in the figures, the dielectric layer may comprise just one layer, for example, the interlayer dielectric layer 230. In further not-shown embodiments, the dielectric layer may comprise additional layers, such as a low-k material layer, one or more cap layers, etch-stop layers, etc.

As shown in FIG. 2d, a stressed material layer 220 is deposited onto the surface of the semiconductor structure 200. It should be noted that, when depositing the stressed material layer 220, the exposed surface of the semiconductor structure 200 includes the upper surface of the gate cap layer 266. The stressed material layer 220 typically comprises silicon nitride. After depositing the stressed material layer 220, a UV curing process is applied at a temperature ranging from 400-500° C.

After performing the UV curing process, an interlayer dielectric (ILD) layer 230 is deposited onto the stressed material layer 220, as shown in FIG. 2e. The ILD layer 230 typically comprises an oxide. For example, the ILD layer 230 comprises silicon dioxide. After being deposited, the ILD layer 230 is preferably back-etched and planarized. This may be achieved by using a well-established technique such as, for example, chemical mechanical planarization (CMP). As a result of the planarization process, the ILD layer 230 exposes a flat surface 200s to the outside defining a substantially horizontal plane.

FIG. 2f shows that, after forming the dielectric layer comprised of the stressed layer 220 and the ILD layer 230, the semiconductor structure 200 undergoes an etching process 281 aimed at forming openings 272 and 274, permitting electrical contact to the source/drain regions 251 and the gate electrode 260 of the transistor 250, respectively. Etching 281 is preferably anisotropic. According to some embodiments, etching 281 comprises a plasma-enhanced etch.

A patterned mask 234 may be used during the etching process 281 in order to open openings 272 and 274 in predetermined positions of the exposed surface of the dielectric layers 220, 230. The mask 234 is generally removed after carrying out the etching process 281.

It should be noted that, in the case of a gate structure 260 with extremely reduced dimensions, forming aperture 274 in the desired position might not be a trivial task. For example, if the gate structure 260 has a length of about 28 nm or 22 nm, the width of the opening 274 may not be greater than about 10 nm. This requires extremely advanced optical lithography techniques to be used for patterning the etching mask 234. In particular, the resolution of the lithographic technique must be less than 5 nm.

Etching 281 is calibrated so as to stop at the surface of the metal silicide layer 253, analogously to the method known from the prior art. However, unlike the prior art method, the etching process 281 etches a portion of the gate structure in order to expose a surface portion of gate bottom portion 260b.

The parameters of the etch 281 are chosen so as to form openings extending through the ILD layer 230, the stressed material layer 220 and an upper portion of the gate structure 260. More specifically, according to some embodiments, the etching 281 is performed for a sufficient time and by using appropriate parameters in order that the ILD layer 230, the stressed material layer 220, the gate cap layer 266 and the gate material 262 are etched across their entire respective thicknesses. In this manner, openings 274 formed by the etching 281 leave an upper surface of the gate bottom portion 260b exposed to the outside. Analogously, the openings 272 formed by etching 281 extend through the ILD layer 230 and the stressed material layer 220, so as to leave exposed a portion of the metal silicide layer 253 formed on the surface of the source/drain regions 251.

According to the embodiment shown in FIG. 2f, etching 281 is calibrated so as to stop at the surface of the etch-stop layer 265. In this case, the surface of the gate bottom portion 260b left exposed by the etching 281 is the surface of the etch-stop layer 265. According to a further embodiment not shown in the figures, etching 281 is performed so as to stop at a surface of the gate metal layer 264, thus leaving that surface of the gate metal layer 264 exposed. This latter embodiment is preferred in those cases in which the etch-stop layer 265 is absent from the gate structure 260 and the gate material 262 is formed directly on the gate metal layer 264.

Figure 2G:
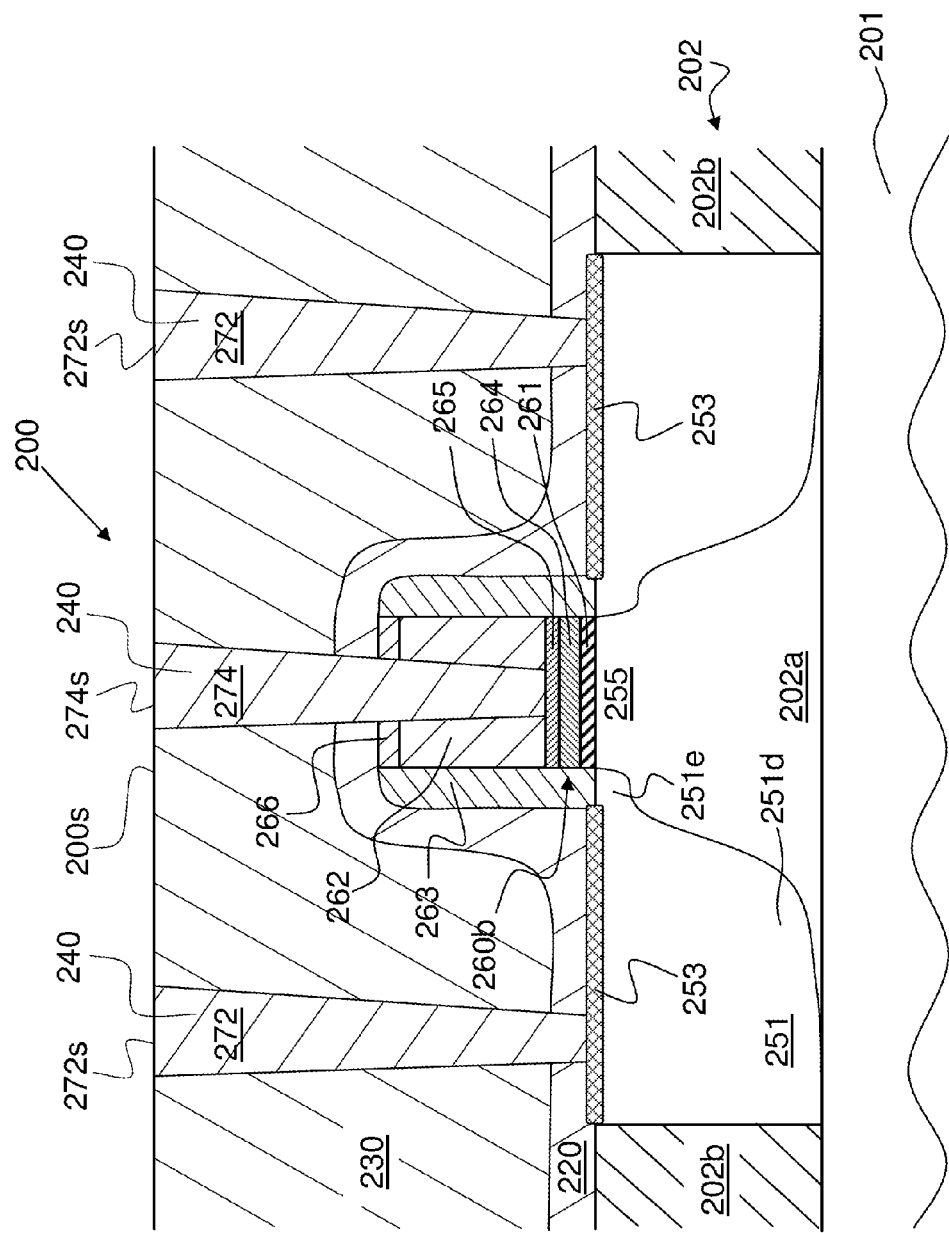

As shown in FIG. 2g, after forming openings 272 and 274, these are filled by a material 240 having a high electrical conductivity. The material 240 typically comprises a highly conductive metal. For example, the material 240 may comprise one or more metals such as aluminum, copper, tungsten, silver, gold and the like. Highly conductive contact material 240 may also comprise a metal alloy.

Filling openings 272 and 274 with a metallic material may be achieved, for example, by means of the damascene technique. Thus, a contact metal film 240 is initially deposited on the surface of the semiconductor structure 200. The deposition may be performed by a well-established technique, such as chemical vapor deposition (CVD). Alternatively, the conductive film 240 may be deposited by using electrochemical techniques such as electroplating or electroless plating. Thereafter, the excess of material 240 and, where needed, an upper portion of the ILD layer 230 may be removed. Removal may be achieved, for example, by chemical mechanical polishing.

FIG. 2g shows the semiconductor structure 200 after completion of the removal process. The portion of the contact metal film 240 included in the openings 272 is in electrical contact with the source and drain regions 251 through the metal silicide layer 253. Furthermore, the portion of the metal film 240 included in the opening 274 is in electrical contact with the gate metal layer 264. In the embodiment shown in FIG. 2g, the portion of the metal film 240 in aperture 274 is in electrical contact with the gate metal layer 264 through the electrically conductive etch-stop layer 265. In other embodiments not shown in the figures, the portion of metal film 240 in the opening 274 forms an interface with the gate metal layer 264, without the presence of the etch-stop layer 265.

As a result of the planarization process, the semiconductor structure 200 exposes a substantially flat surface 200s including portions of the metal layer 240 alternated to portions of the ILD layer 230. More specifically, the exposed surface 200s comprises regions 272s exposing portions of metal film 240 included in openings 272. Regions 272s enable an electrical contact to the source and drain regions 251. Furthermore, the surface 200s comprises regions 274s exposing portions of the metal film 240 included in the opening 274. Regions 274s enable an electrical contact to the gate metal layer 264 and, thus, to the gate structure 260.

As apparent from the description provided above, the manufacturing method hereby proposed and the resulting semiconductor structure 200 enable a dramatic simplification and a considerable reduction of costs with respect to the traditional method described above with reference to FIGS. 1a-1i.

The costly and complicated process of removing the gate cap layer is omitted altogether in the claimed method. Thus, the transistor included in the final semiconductor structure still displays at least a portion of the gate cap layer 266 initially formed when forming the gate structure 260. This results in a considerably more convenient, faster and more cost-effective manufacturing flow with a reduced number of process steps, such as depositions, etches, layer removals, etc. Manufacturing costs, as well as cycle time (time-to-market), can thus be reduced.

Figure 1D:
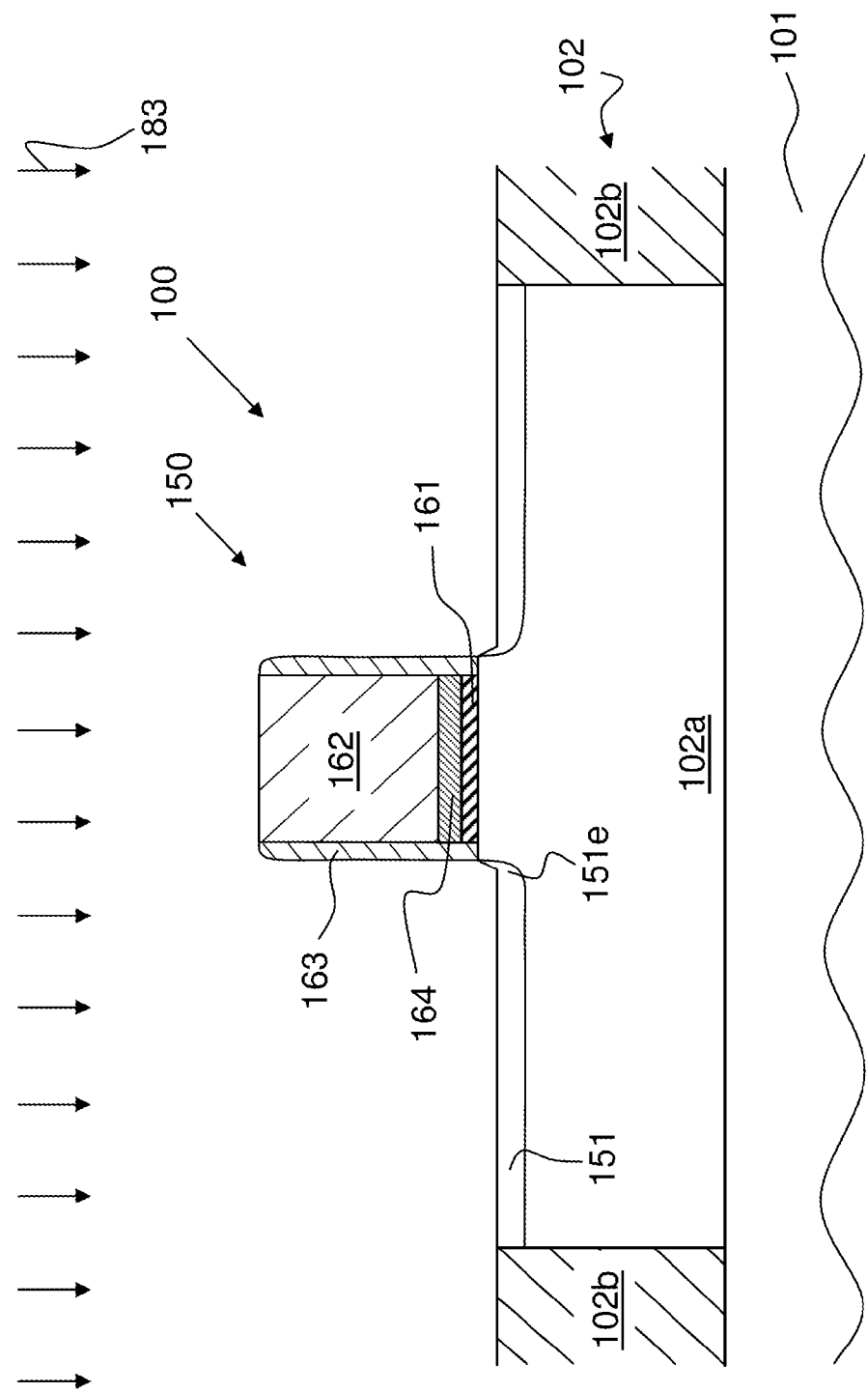
Figure 1F:
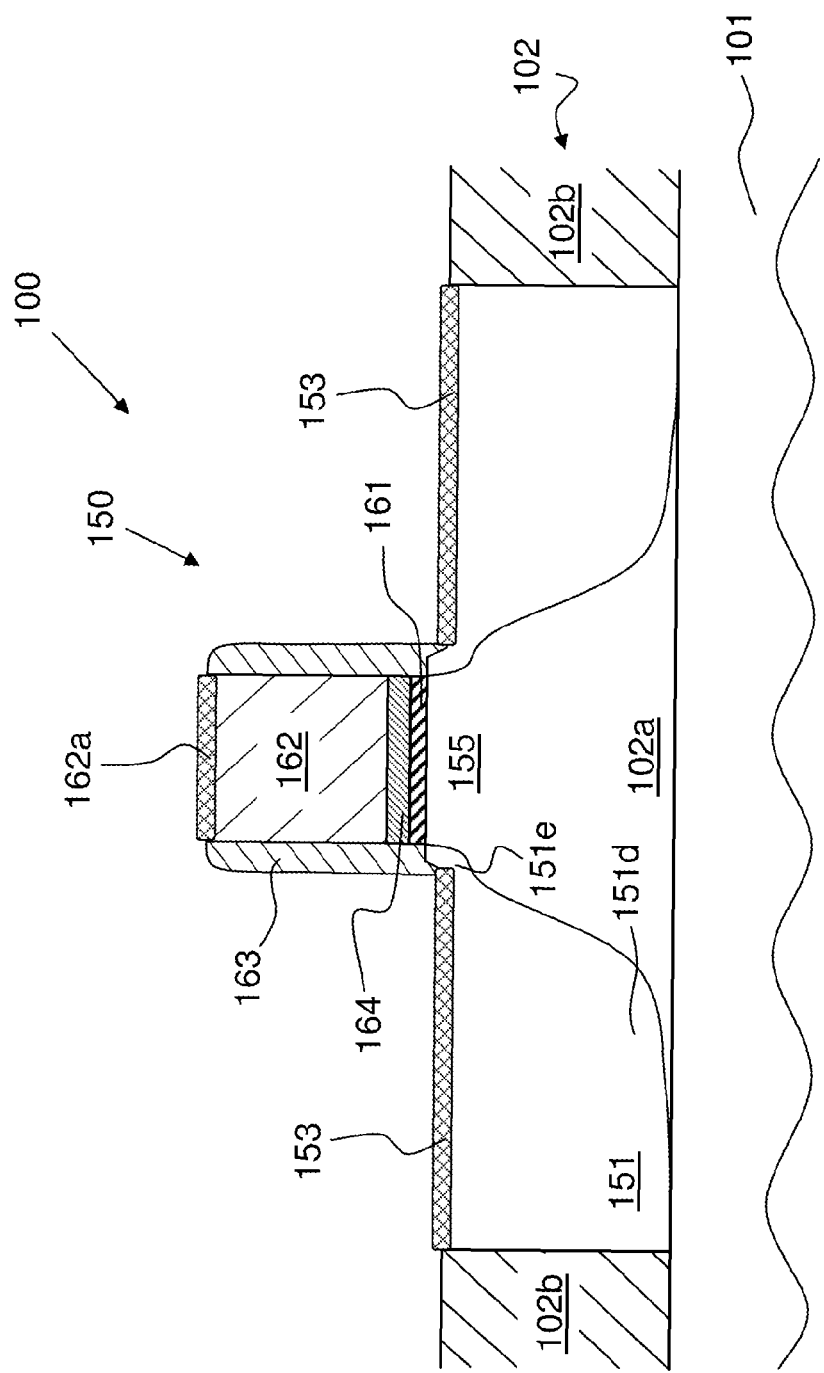
Figure 1G:
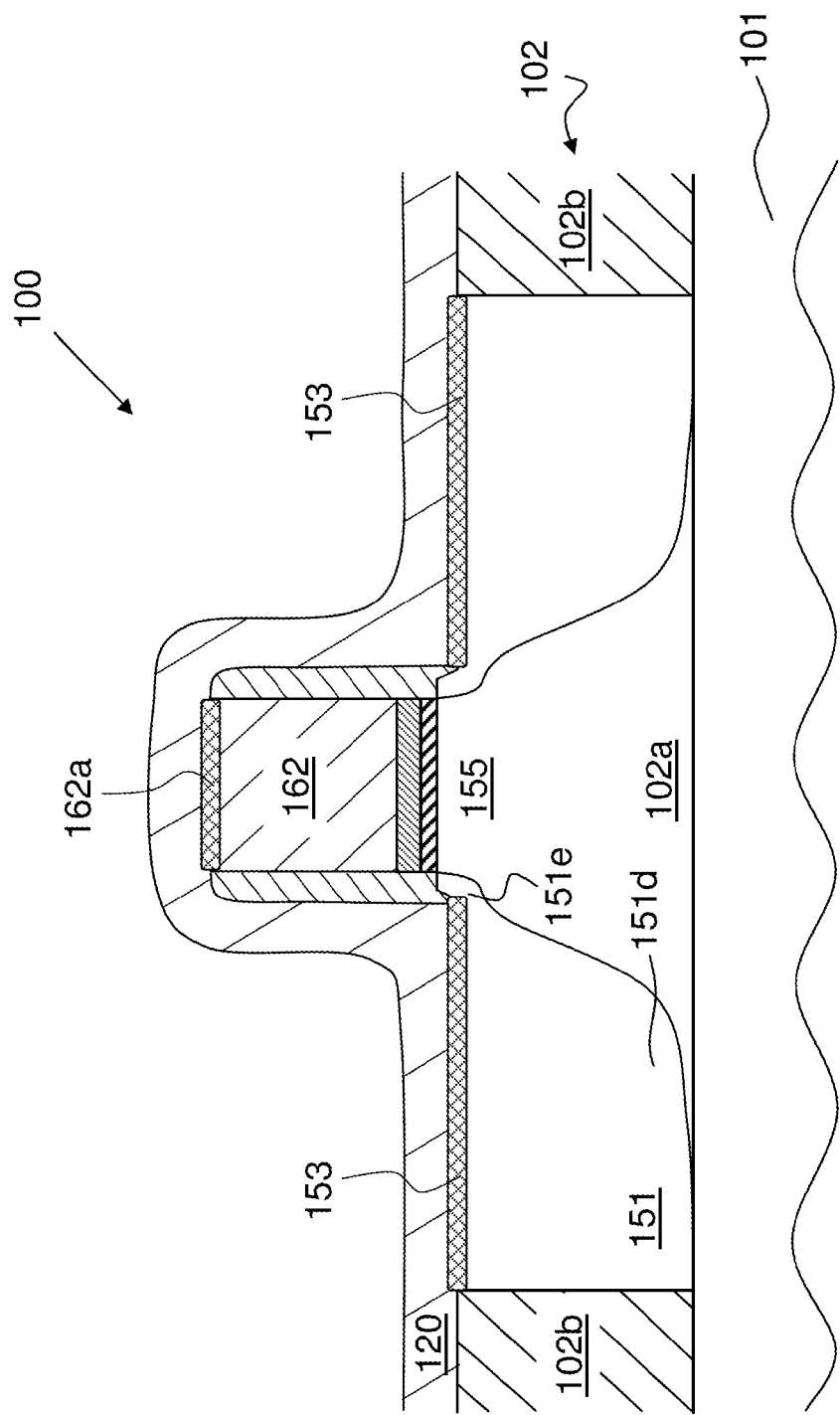
Figure 1H:
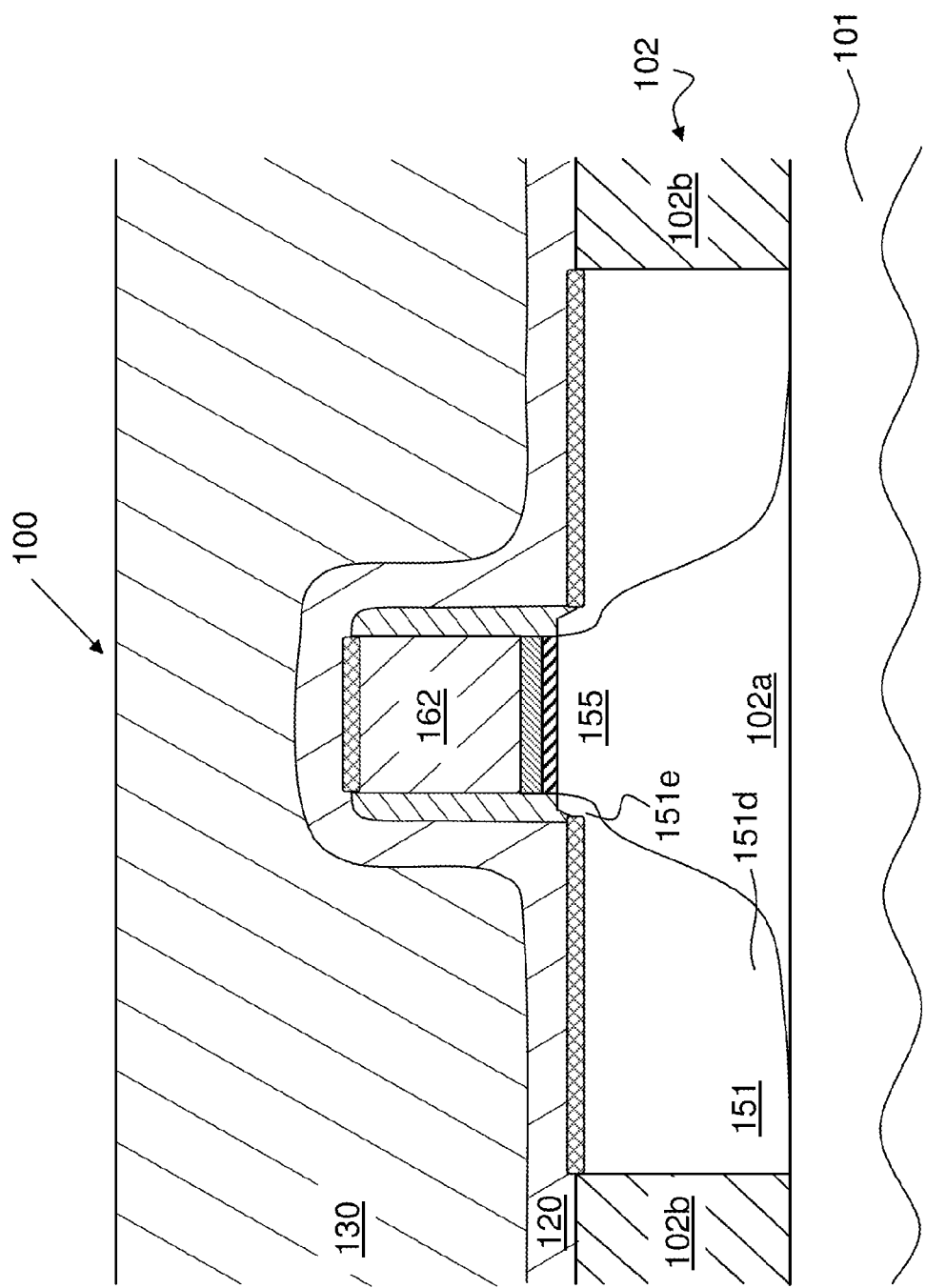
Figure 1I:
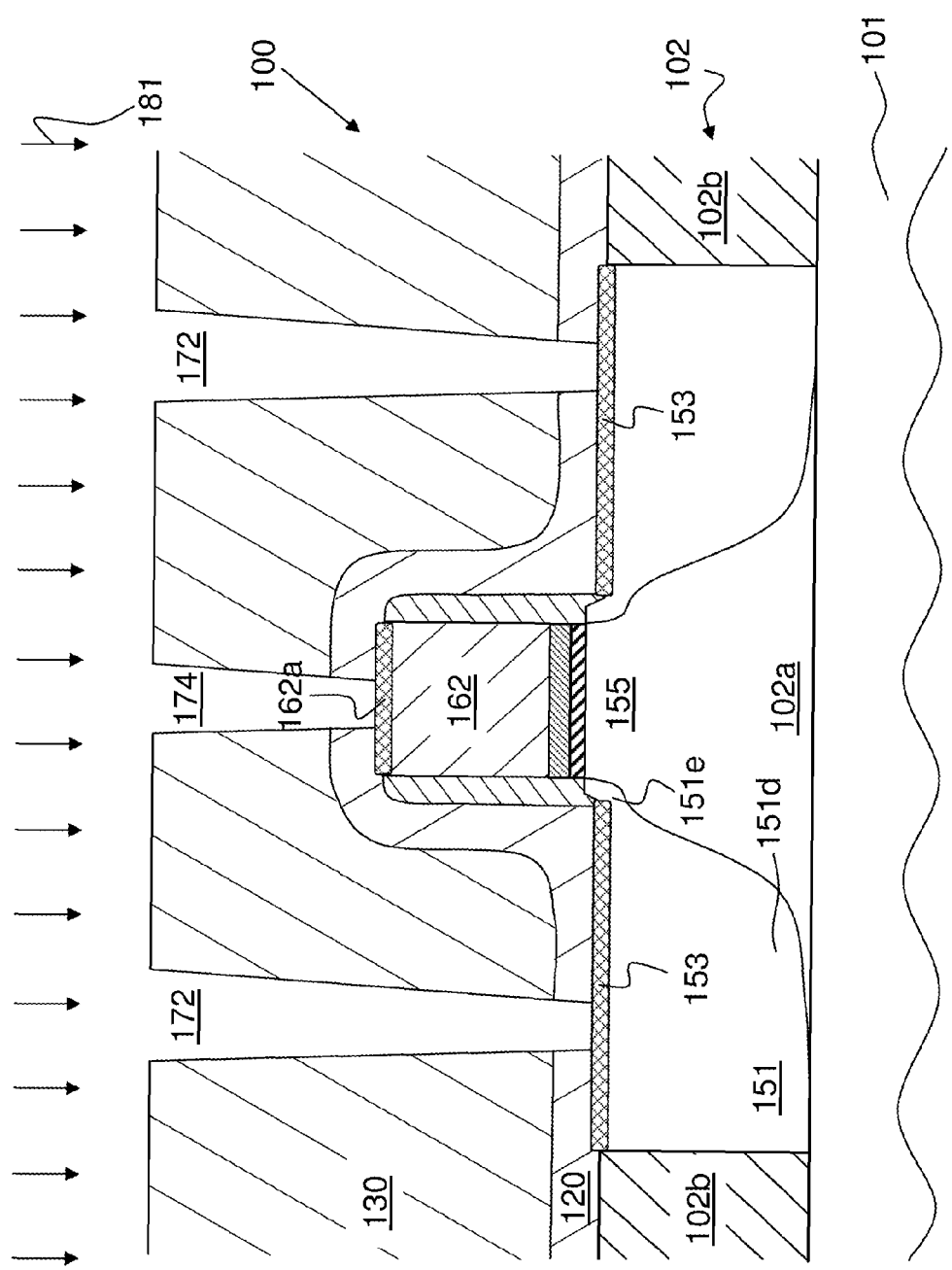

By omitting the gate cap layer removal process, the semiconductor structure does not have to undergo any etching processes aimed at removing the optical planarization layer or the sacrificial oxide layer used when removing the gate cap layer. Thus, the etching 183 described with reference to FIG. 1d is not necessary in the claimed method and is advantageously omitted.

Consequently, the transistor source and drain regions are not undesirably eroded, in contrast to the traditional method using etching process 183 following gate cap layer removal. The parasitic resistance of the source and drain regions may, thus, be reduced, thereby allowing higher drive currents to be used at a given voltage. This results in an improvement of the semiconductor device including the transistor.

Furthermore, according to the claimed device and method, the metal 240 filled in apertures 274 contacts the gate metal layer 264, either directly or through the conductive etch-stop layer 265. No semiconductor gate material 262 is present between the metal 240 and the gate metal layer 264. Thus, the Schottky barrier, undesirably established at the interface between the gate material and the gate metal layer according to the traditional method, is here prevented from forming. Thus, by replacing a metal-semiconductor interface with a metal-metal interface in the gate structure, the AC performance of the device may be dramatically improved.

The claimed device and method find a particularly advantageous application in conjunction with the HKMG technology. In particular, the invention hereby proposed may be advantageously applied to the gate-first HKMG approach. The claimed method and device may be applied to all manufacturing technologies starting from 45 nm and beyond. In particular, the claimed method and device may be applied to the 28-nm-technology and beyond.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an active region in a semiconductor layer of a semiconductor substrate;
    forming a gate structure of a transistor above said active region, said gate structure comprising;
        an HKMG material stack, comprising:
            a gate metal layer; and
            a conductive etch-stop layer formed above and conductively coupled to said gate metal layer;
        a gate electrode material formed above said conductive etch-stop layer of said HKMG material stack; and
        a gate cap layer formed above said gate electrode material;
    after forming said gate structure, forming a sidewall spacer structure adjacent to sidewalls of said gate structure, said sidewall spacer structure laterally confining sidewall surfaces of said HKMG material stack, said gate electrode material, and said gate cap layer;
    forming source and drain regions of said transistor in said active region;
    forming a dielectric material above said transistor, said dielectric material covering at least an upper surface of said gate cap layer; and
    forming a contact opening that extends through said dielectric material, said gate cap layer, and said gate electrode material so as to expose a first upper surface portion of said HKMG material stack and inside sidewalls of said gate electrode material while said gate electrode material covers a remaining upper surface portion of said HKMG material stack.

2. The method of claim 1, further comprising forming a conductive contact element in said contact opening, said conductive contact element directly contacting said first upper surface portion of said HKMG material stack and said inside sidewalls of said gate electrode material.

3. The method of claim 2, wherein said HKMG material stack further comprises a gate insulation layer formed below said gate metal layer, said gate insulation layer comprising a high-k dielectric material having a dielectric constant greater than approximately 10 and said gate metal layer comprising a work function metal species.

4. The method of claim 1, wherein said contact opening is a first contact opening, the method further comprising forming a plurality of second contact openings that extend through said dielectric material and expose at least a portion of a respective one of said source and drain regions.

5. The method of claim 4, further comprising forming a first conductive contact element in said first contact opening and forming a second conductive contact element in each of said plurality of second contact openings.

6. The method of claim 5, wherein forming said first and second conductive contact and second contact openings with a conductive contact metal and performing a planarization process to remove excess portions of said conductive contact metal formed outside of said first and second contact openings and above said dielectric material during said material deposition process.

7. The method of claim 4, further comprising forming a metal silicide layer on an upper surface said source and drain regions, each of said plurality of second contact openings exposing at least a portion of said metal silicide layer.

8. The method of claim 1, wherein forming said dielectric material above said transistor comprises forming a stressed material layer covering said gate structure and said source and drain regions and forming an interlayer dielectric layer above said stressed material layer.

9. The method of claim 1, wherein forming said gate structure comprises:
    forming an HKMG material stack layer above said active region, said HKMG material stack layer comprising at least said gate metal layer and said conductive etch-stop layer;
    forming a gate electrode material layer above said HKMG material stack layer;
    forming a cap material layer above said gate electrode material layer; and
    patterning said gate structure from said HKMG material stack layer, said gate electrode material layer, and said cap material layer during a common patterning process.

10. The method of claim 1, wherein said contact opening extends between opposing sidewalls of said sidewall spacer structure.

11. The method of claim 1, wherein forming said contact opening comprises performing an anisotropic etching process while using said conductive etch-stop layer as an etch stop, wherein said first upper surface portion of said HKMG material stack exposed by said contact opening comprises an upper surface portion of said conductive etch-stop layer, and wherein said contact opening does not expose said gate metal layer.

12. A method, comprising:
    forming a gate material stack above an active region formed in a semiconductor layer of a semiconductor substrate, said gate material stack comprising:
        a layer of gate insulation material;
        a layer of metal gate material formed above said layer of gate insulation material;
        a layer of conductive etch-stop material formed above said layer of metal gate material;
        a layer of gate electrode material formed above said layer of conductive etch-stop material; and
        a layer of dielectric cap material formed above said layer of gate electrode material;
    patterning a gate structure from said gate material stack during a common gate patterning process, said gate structure comprising:
        a gate insulation layer comprising said layer of gate insulation material;

a gate metal layer positioned above said gate insulation layer and comprising said layer of metal gate material;
a conductive etch-stop layer positioned above said gate metal layer and comprising said layer of conductive etch-stop material;
a gate electrode layer positioned above said conductive etch-stop layer and comprising said layer of gate electrode material; and
a cap layer positioned above said gate electrode layer and comprising said layer of dielectric cap material;
after patterning said gate structure, forming a layer of stressed dielectric material above said transistor, said layer of stressed dielectric material covering at least said gate structure and an upper surface of said active region;
forming a contact opening extending through said layer of stressed dielectric material, said cap layer, and said gate electrode layer, wherein said contact opening exposes a first upper surface portion of said conductive etch-stop layer and said gate electrode layer covers a remaining upper surface portion of said conductive etch-stop layer; and
forming a conductive contact element in said contact opening, wherein a bottom surface of said conductive contact element directly contacts said first upper surface portion of said conductive etch-stop layer and sidewall surfaces of said contact element directly contact said gate electrode layer.

13. The method of claim 12, wherein said gate insulation layer comprises a high-k dielectric material having a dielectric constant greater than approximately 10 and said gate metal layer comprises a work function metal species.

14. The method of claim 12, wherein forming the contact opening comprises performing an anisotropic etching process to etch through said stressed dielectric material layer, said cap layer, and said gate electrode layer while using said conductive etch-stop layer as an etch stop.

15. The method of claim 14, wherein said conductive etch-stop layer comprises aluminum.

16. The method of claim 12, wherein said conductive contact element comprises one of aluminum, copper, tungsten, silver, and gold.

17. The method of claim 12, further comprising, after forming said gate structure, forming a sidewall spacer structure adjacent to sidewalls of said gate structure, wherein said at least one contact opening extends between opposing sidewalls of said sidewall spacer structure.

18. The method of claim 12, wherein said conductive etch-stop layer is positioned between and separates said bottom surface of said conductive contact element from an upper surface of said gate metal layer.

19. A method, comprising:
forming an active region in a semiconductor layer of a semiconductor substrate;
forming a gate structure of a transistor above said active region, said gate structure comprising:
a gate insulation layer;
a gate metal layer formed above said gate insulation layer;
a conductive etch-stop layer formed above said gate metal layer;
a gate electrode material formed above said conductive etch-stop layer; and
a dielectric cap layer formed above said gate electrode material;
after forming said gate structure, forming a sidewall spacer structure adjacent to sidewalls of said gate structure, said sidewall spacer structure laterally confining sidewall surfaces of at least said gate insulation layer, said gate metal layer, said conductive etch stop layer, and said gate electrode material;
forming source and drain regions in said active region and laterally adjacent to said gate structure;
forming an interlayer dielectric material above said transistor, said interlayer dielectric material covering said gate structure and an upper surface of said drain and source region;
forming a patterned mask layer above said interlayer dielectric material; and
performing an etching process through said patterned mask layer to form at least one contact opening that extends through at least said interlayer dielectric material, said cap layer, and said gate electrode material, said conductive etch-stop layer being used as an etch stop during said etching process, wherein after forming said at least one contact opening a first portion of said gate electrode material is exposed by sidewalls of said at least one contact opening, a second portion said gate electrode material covers an upper surface portion of said conductive etch-stop layer, and said conductive etch-stop layer covers an entire upper surface of said gate metal layer.

20. The method of claim 19, further comprising forming a conductive contact element in said contact opening, said conductive contact element directly contacting said gate electrode material and said conductive etch-stop layer.

21. The method of claim 20, wherein forming said conductive contact element comprises conductively coupling said gate metal layer to said conductive contact element with said conductive etch-stop layer.

22. The method of claim 20, wherein said conductive contact element comprises one of aluminum, copper, tungsten, silver, and gold.

23. The method of claim 19, wherein said gate insulation layer comprises a high-k dielectric material having a dielectric constant greater than approximately 10, said gate metal layer comprises a work function metal species, and said conductive etch-stop layer comprises aluminum.

24. The method of claim 19, wherein said contact opening extends between opposing sidewalls of said sidewall spacer structure.

* * * * *